US010763639B2

(12) United States Patent
Lee et al.

(10) Patent No.: US 10,763,639 B2
(45) Date of Patent: Sep. 1, 2020

(54) EMITTER-ON-SUB-MOUNT DEVICE

(71) Applicant: Lumentum Operations LLC, Milpitas, CA (US)

(72) Inventors: Kong Weng Lee, San Jose, CA (US); Vincent V. Wong, Los Altos, CA (US); Jay A. Skidmore, San Jose, CA (US); Prasad Yalamanchili, Santa Clara, CA (US); Gity Samadi, Milpitas, CA (US); Raman Srinivasan, Milpitas, CA (US); Yongfeng Guan, Milpitas, CA (US); Slava Khassine, Milpitas, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 16/253,471

(22) Filed: Jan. 22, 2019

(65) Prior Publication Data

US 2019/0252849 A1 Aug. 15, 2019

Related U.S. Application Data

(60) Provisional application No. 62/629,521, filed on Feb. 12, 2018.

(51) Int. Cl.
| | |
|---|---|
| *H01L 33/60* | (2010.01) |
| *H01L 33/62* | (2010.01) |
| *H01S 5/02* | (2006.01) |
| *H01S 5/00* | (2006.01) |
| *H01S 5/022* | (2006.01) |

(52) U.S. Cl.
CPC .......... *H01S 5/02244* (2013.01); *H01L 33/60* (2013.01); *H01L 33/62* (2013.01); *H01S 5/0071* (2013.01); *H01S 5/02276* (2013.01)

(58) Field of Classification Search
CPC ..... H01L 33/60; H01L 33/62; H01S 5/02244; H01S 5/0071; H01S 5/02276
See application file for complete search history.

(56) References Cited

U.S. PATENT DOCUMENTS

| | | | | |
|---|---|---|---|---|
| 4,246,697 | A * | 1/1981 | Smith | H01L 23/057 257/E23.044 |
| 5,309,014 | A * | 5/1994 | Wilson | H01L 23/13 257/584 |
| 5,905,750 | A * | 5/1999 | Lebby | H01S 5/02296 369/121 |
| 9,666,776 | B2 * | 5/2017 | Takada | H01L 33/486 |
| 2006/0049548 | A1 * | 3/2006 | Auburger | B29C 45/0055 264/400 |
| 2006/0258031 | A1 * | 11/2006 | Wang | H01L 23/544 438/29 |

(Continued)

*Primary Examiner* — Ida M Soward
(74) *Attorney, Agent, or Firm* — Harrity & Harrity, LLP

(57) ABSTRACT

A device may include a lead-frame including a first electrode and a second electrode, a carrier, a set of optical devices mechanically and electrically connected to the first electrode, and a set of electrical connections that electrically connects the second electrode to the set of optical devices. The lead-frame and the carrier may be mechanically connected to each other via a set of interlocking structures associated with the lead-frame and the carrier. The lead-frame and the set of optical devices may have matching coefficients of thermal expansion. The first electrode and the second electrode may be electrically isolated from each other.

20 Claims, 8 Drawing Sheets

(56) References Cited

U.S. PATENT DOCUMENTS

| | | | |
|---|---|---|---|
| 2007/0090496 A1* | 4/2007 | Otremba | H01L 23/49513 257/666 |
| 2012/0056223 A1* | 3/2012 | Hsieh | H01L 24/24 257/98 |
| 2013/0161670 A1* | 6/2013 | Peng | H01L 33/647 257/98 |

* cited by examiner

EMITTER-ON-SUB-MOUNT DEVICE

RELATED APPLICATIONS

This application claims priority under 35 U.S.C. § 119 to U.S. Provisional Patent Application No. 62/629,521, filed on Feb. 12, 2018, the content of which is incorporated by reference herein in its entirety.

TECHNICAL FIELD

The present disclosure relates to an emitter-on-sub-mount device.

BACKGROUND

An emitter-on-sub-mount device is a device with an emitter mechanically connected to a sub-mount. An emitter is a device in which a beam is emitted in a direction parallel (e.g., horizontally) or perpendicular (e.g., vertically) to a surface of a substrate of the emitter.

SUMMARY

According to some implementations, a device may comprise: a lead-frame comprising a first electrode and a second electrode; a carrier; a set of optical devices mechanically and electrically connected to the first electrode; and a set of electrical connections that electrically connects the second electrode and the set of optical devices to each other, wherein the lead-frame and the carrier are mechanically connected to each other via a set of interlocking structures associated with the lead-frame and the carrier, wherein the lead-frame and the set of optical devices have matching coefficients of thermal expansion, wherein the first electrode and the second electrode are electrically isolated from each other.

According to some implementations, a lead-frame may comprise: a first portion; a second portion; and a respective set of interlocking structures associated with the first portion and the second portion, wherein an optical device is mechanically and electrically connected to the first portion, wherein the first portion and the second portion are electrically isolated from each other, wherein the first portion is associated with a first electrical pad, wherein the second portion is associated with a second electrical pad, wherein the lead-frame has a first coefficient of thermal expansion that matches a second coefficient of thermal expansion of the optical device.

According to some implementations, a device may comprise: a housing; an optical component mechanically connected to the housing; a substrate mechanically connected to the housing; and an emitter-on-sub-mount device mechanically connected to the substrate and within the housing, comprising: a lead-frame comprising a first electrode and a second electrode, and a set of optical devices mechanically and electrically connected to the first electrode and electrically connected to the second electrode, wherein the lead-frame and the set of optical devices have matching coefficients of thermal expansion.

DETAILED DESCRIPTION

The following detailed description of example implementations refers to the accompanying drawings. The same reference numbers in different drawings may identify the same or similar elements.

An emitter-on-sub-mount device may include an emitter package, a laser diode package, and/or the like. Components of an emitter-on-sub-mount device (e.g., an emitter, an electrical pad, a sub-mount, and/or the like), based on materials used to fabricate the components, may have coefficients of thermal expansion (CTEs) that do not match each other. As a result, heat generated during operation of a device that includes the emitter-on-sub-mount device can cause damage to the emitter-on-sub-mount device. For example, the heat may cause different amounts and/or rates of expansion in the components, thereby causing the various components of the emitter-on-sub-mount device to separate from each other. This reduces an operating life of the emitter-on-sub-mount device, negatively impacts performance of the emitter-on-sub-mount device, can cause the emitter-on-sub-mount device to fail, and/or the like.

Some implementations described herein provide an emitter-on-sub-mount device that includes a sub-mount comprising a lead-frame interlocked with a carrier. The lead-frame and the carrier may be configured to reduce or eliminate effects of heat generated during operation of the emitter-on-sub-mount device, such as via material selection, interlocking between the lead-frame and the carrier, and/or the like. In this way, the lead-frame and the carrier reduce or eliminate expansion (or differences in expansion) of the components of the emitter-on-sub-mount device caused by heat generated during operation of the emitter-on-sub-mount device. This reduces or eliminates separation (or a risk of separation) that could occur between components of the emitter-on-sub-mount device, thereby reducing or eliminating a risk of the operations of the emitter-on-sub-mount device failing during use of the emitter-on-sub-mount device, thereby increasing an operating life of the emitter-on-sub-mount device, and/or the like.

Figure 1A:
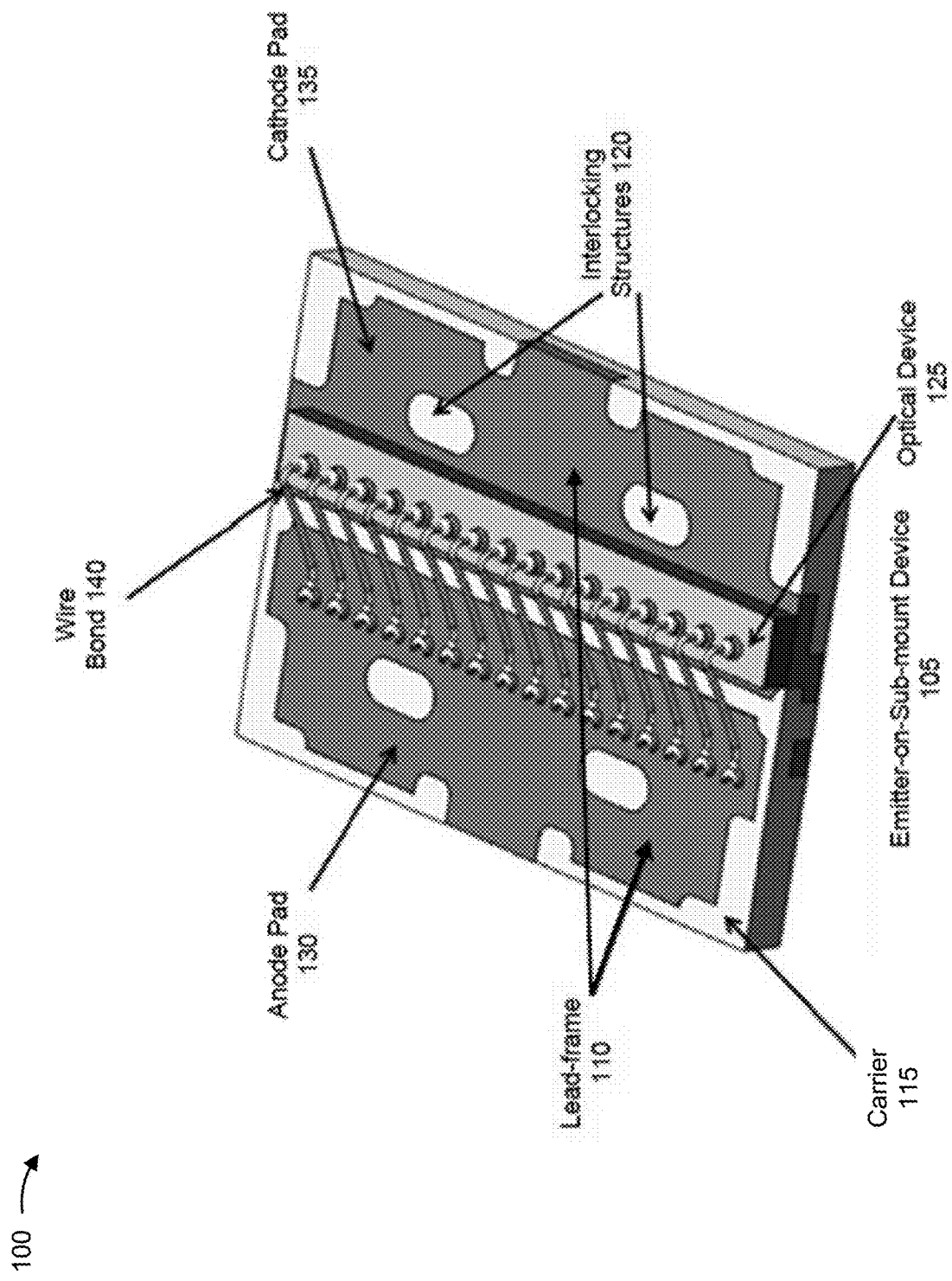
FIGS. 1A and 1B are diagrams of an example emitter-on-sub-mount device.
Figure 1B:
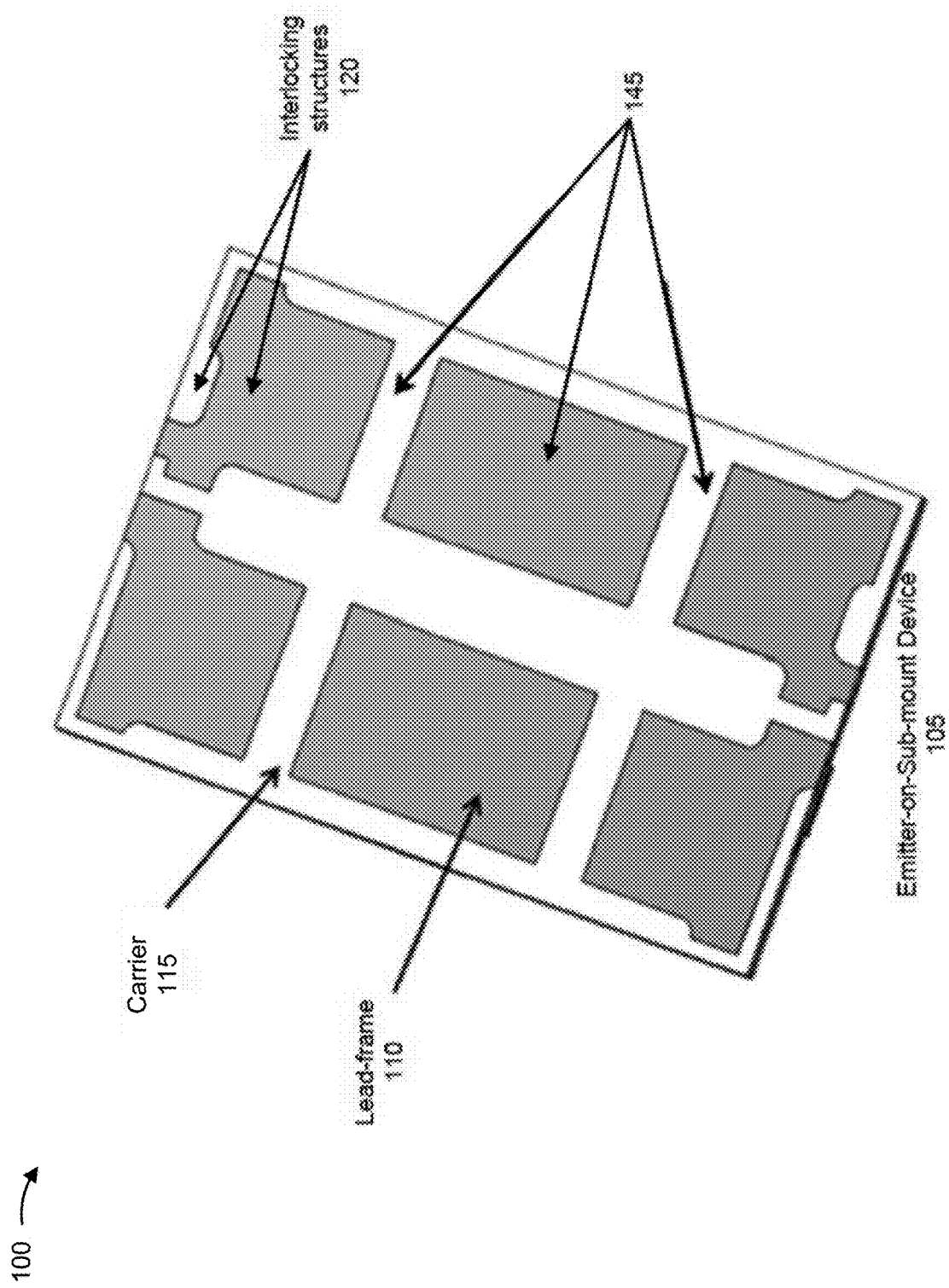

FIGS. 1A and 1B are diagrams 100 of an example emitter-on-sub-mount device. FIG. 1A shows a top view of an emitter-on-sub-mount device 105. In some implementations, emitter-on-sub-mount device 105 may include a sub-mount comprising a lead-frame 110 and a carrier 115, a set of interlocking structures 120, an optical device 125, various electrical pads (or electrodes) (e.g., an anode pad 130 and a cathode pad 135), and a set of wire bonds 140, as described elsewhere herein. In some implementations, emitter-on-sub-mount device 105 may be used with various types of devices, such as a smartphone, a smart wristwatch, and/or or another type of compact and/or handheld device (e.g., where sub-millimeter dimensions are needed). For example, emitter-on-sub-mount device 105 may have length dimensions between one millimeter (mm) and 2 mm and width dimensions between 2 mm and 3 mm, thereby facilitating use of emitter-on-sub-mount device 105 with mobile and/or handheld applications; however, the implementations described herein apply equally to other emitter-on-sub-mount devices 105 with different dimensions. In addition, emitter-on-sub-mount device 105 may be used with other types of devices, such as desktop or table-mounted devices, a device on a vehicle (e.g., a device used for three-dimensional sensing), and/or the like.

In some implementations, lead-frame 110 includes one or more components of a sub-mount of emitter-on-sub-mount device 105. For example, lead-frame 110 may include a portion of the body of the sub-mount, may include anode pad 130 and/or cathode pad 135, and/or the like. In some implementations, lead-frame 110 may be attached to carrier 115 to form the sub-mount of the emitter-on-sub-mount device 105. For example, lead-frame 110 and carrier 115 may be attached to each other via a respective set of interlocking structures 120, via epoxy, by molding one of lead-frame 110 and carrier 115 around the other of lead-frame 110 and carrier 115, and/or the like. In some implementations, lead-frame 110 (or components of lead-frame 110) may be formed via etching, stamping, molding, and/or the like.

In some implementations, lead-frame 110 may comprise one or more materials. For example, lead-frame 110 may comprise copper tungsten (CuW) for a body of lead-frame 110, may comprise metal plating on one or more surfaces of lead-frame 110 (e.g., gold plating (e.g., such as nickel gold (NiAu) plating), silver plating, and/or the like) for electrical connectivity and/or reduction of oxidation, and/or the like. In some implementations, lead-frame 110 may have a CTE that matches a CTE of optical device 125 (e.g., that matches a substrate, such as a gallium arsenide (GaAs) substrate, or another layer, of optical device 125). For example, lead-frame 110 and optical device 125 may have CTEs that are within approximately 20 percent of each other (e.g., within 25 percent of each other, within 22 percent of each other, within 17 percent of each other, and/or the like). In some implementations, materials may be selected for lead-frame 110 during fabrication of lead-frame 110 based on CTEs of the materials and predicted CTEs of other components of emitter-on-sub-mount device 105 to which lead-frame 110 is to be mechanically connected. For example, a variation of CuW, such as Cu7W93, Cu10W90, and/or the like, may be selected for lead-frame 110 based on the respective CTE for these materials and depending on a predicted CTE of optical device 125 to which lead-frame 110 is to be attached. For example, and assuming that Cu7W93 has a CTE of 6.0 parts per million per Kelvin (ppm/K), Cu7W93 may be selected for lead-frame 110 if optical device 125 is predicted to have a matching CTE (e.g., a CTE within 20 percent of 6.0 ppm/K (e.g., a CTE between 4.8 ppm/K and 7.2 ppm/K)). Matching CTEs of lead-frame 110 and optical device 125 improves a reliability and performance of emitter-on-sub-mount device 105 by reducing mechanical stress on an active region of optical device 125, by reducing or eliminating mechanical stresses caused by different amounts or rates of expansion between components of emitter-on-sub-mount device 105 that are mechanically connected to each other during operation of emitter-on-sub-mount device 105, and/or the like.

In some implementations, the sub-mount includes one or more components of emitter-on-sub-mount device 105. For example, the body of the sub-mount may include the combination of lead-frame 110 and carrier 115. In some implementations, carrier 115 (or components of carrier 115) may be formed via etching, stamping, molding, and/or the like.

In some implementations, carrier 115 may comprise one or more materials. For example, carrier 115 may comprise plastic, such as a liquid crystal polymer (LCP) and/or a silicone molding compound (SMC), a ceramic, a metal, and/or the like. In some implementations, carrier 115 may include an electrically resistive material (e.g., to electrically isolate anode pad 130 and cathode pad 135 from each other), a semi-rigid material (e.g., to reduce or eliminate deformation of emitter-on-sub-mount device 105 during operation of emitter-on-sub-mount device 105), and/or the like. In some implementations, carrier 115 may have a high deformation temperature (e.g., greater than 300 degrees Celsius). Use of these types of materials for carrier 115 facilitates manufacturing processes (e.g., assembly and/or reflow processes) at higher temperatures than normal due to the high deformation temperature, thereby introducing greater tolerances and/or flexibility into the manufacturing process for manufacturing emitter-on-sub-mount device 105. Additionally, or alternatively, use of carrier 115 in combination with lead-frame 110 to form the sub-mount of emitter-on-sub-mount device 105 reduces a cost of fabricating emitter-on-sub-mount device 105 relative to using a single material, such as CuW, AlN, and/or the like for the body of the sub-mount. Additionally, or alternatively, use of carrier 115 in combination with lead-frame 110 facilitates heat dissipation and/or absorption via carrier 115 during use of emitter-on-sub-mount device 105, depending on materials used for carrier 115. This improves an operation of emitter-on-sub-mount device 105, reduces a risk of damage to emitter-on-sub-mount device 105 from heat generated during operation of emitter-on-sub-mount device 105, and/or the like.

In some implementations, interlocking structure 120 includes one or more components associated with mechanically connecting lead-frame 110 and carrier 115. For example, interlocking structure 120 may include a mesa, a trench, a cavity, a peg, an opening, a ridge, a groove, a panel, protrusion, a recess, and/or the like. In some implementations, interlocking structures 120 may comprise different material than components with which interlocking structures 120 are associated. For example, interlocking structures 120 of lead-frame 110 may comprise a different material than lead-frame 110, such as when interlocking structures 120 are manufactured separately from lead-frame 110 and are mechanically connected to lead-frame 110 after being manufactured (e.g., via epoxy, solder, and/or the like).

In some implementations, a first interlocking structure 120 of lead-frame 110 and a second interlocking structure 120 of carrier 115 may mate with each other to mechanically connect lead-frame 110 and carrier 115. For example, and as identified in FIG. 1A by the arrows associated with the label "Interlocking Structures 120," a mesa of carrier 115 may mate with a cavity of lead-frame 110 to mechanically connect lead-frame 110 and carrier 115. In some implementations, mechanical pressure, friction, and/or the like produced from interlocking structures 120 of lead-frame 110 and carrier 115 may mechanically connect lead-frame 110 and carrier 115. Additionally, or alternatively, lead-frame 110 and carrier 115 may be mechanically connected via use of epoxy, solder, and/or the like applied to the interlocking structure 120 of lead-frame 110 and carrier 115.

In some implementations, interlocking structure 120 may be formed via etching, stamping, molding, and/or the like. For example, etching, stamping, molding, and/or the like may be used to form the mesa and cavity described above. In some implementations, interlocking structure 120 may be formed during formation of the component with which interlocking structure 120 is associated (e.g., a mesa interlocking structure of lead-frame 110 may be formed during formation of lead-frame 110). Additionally, or alternatively, interlocking structure 120 may be formed separately from the component with which interlocking structure 120 is associated, and may be mechanically attached to the component after formation of the component (e.g., via use of epoxy, solder, and/or the like).

In some implementations, optical device 125 includes a set of light-emitting devices. For example, optical device 125 may include an emitter, a light-emitting diode (LED), a laser, an edge-emitting laser, a vertical cavity surface emitting laser (VCSEL), a vertical external cavity surface emitting laser (VECSEL), a die that includes one or more light-emitting devices, and/or the like. In some implementations, optical device 125 may include one or more dies that each include one or more emitters. In some implementations, emitter-on-sub-mount device 105 may include one or more optical devices 125 (e.g., that each include a single die or multiple dies, where each die includes a single emitter or multiple emitters).

In some implementations, optical device 125 may be mechanically and/or electrically connected to lead-frame 110. For example, and as shown in FIG. 1A, optical device 125 may be mechanically and electrically connected to cathode pad 135 (e.g., via solder, epoxy, and/or the like) and may be electrically connected to anode pad 130 via wire bonds 140 (e.g., a p-up configuration where wire bonds 140 are connected to a p side of optical device 125). Conversely, and as another example, optical device 125 may be mechanically and electrically connected to anode pad 130 and may be electrically connected to cathode pad 135 via wire bonds 140 (e.g., a p-down configuration where a p side of optical device 125 is used to mechanically and electrically connect optical device 125 to anode pad 130).

In some implementations, optical device 125 may be mechanically connected to lead-frame 110 via use of solder, paste, epoxy, and/or the like. In some implementations, the material used to mechanically connect lead-frame 110 and optical device 125 to each other may be selected based on the material(s) that lead-frame 110 and/or optical device 125 comprise. For example, the material(s) may be selected to match metal plating on surfaces of lead-frame 110 and/or optical device 125 (e.g., a gold epoxy may be selected when lead-frame 110 and/or optical device 125 are plated with gold), to facilitate electrical connection between optical device 125 and an electrical pad of lead-frame 110 (e.g., an electrically conductive material may be selected), and/or the like.

In some implementations, anode pad 130 includes a positively charged electrical pad, electrode, and/or the like. In some implementations, anode pad 130 may be included in lead-frame 110. For example, a portion of lead-frame 110 may function as anode pad 130, as described elsewhere herein. In some implementations, cathode pad 135 includes a negatively charged electrical pad, electrode, and/or the like. In some implementations, cathode pad 135 may be included in lead-frame 110. For example, a portion of lead-frame 110 may function as cathode pad 135 (e.g., a different portion of lead-frame 110 than that which functions as anode pad 130), as described elsewhere herein. In some implementations, anode pad 130 and cathode pad 135 may be electrically isolated from each other (e.g., based on being included in electrically isolated portions of lead-frame 110, based on one or more features of carrier 115, and/or the like, as described elsewhere herein). Electrical isolation of two components may refer to an inability of electrical current to flow between the two components, may refer to less than a threshold amount of electrical current flowing between the two components such that the electrical current does not interfere with operations of either component, and/or the like.

In some implementations, wire bond 140 includes one or more wires that electrically connect components of emitter-on-sub-mount device 105 and/or a device that includes emitter-on-sub-mount device 105. For example, and as shown in FIG. 1A, wire bonds 140 electrically connect optical device 125 and anode pad 130 to each other. In some implementations, wire bond 140 may comprise gold, silver, copper, aluminum, and/or another electrically conducting material.

FIG. 1B shows a bottom view of emitter-on-sub-mount device 105. Reference number 145 shows example interlocking of lead-frame 110 and carrier 115. For example, rectangular mesa-like structures of lead-frame 110 may be mechanically mated with cavities of carrier 115 to interlock lead-frame 110 and carrier 115. As further shown by reference number 145, the interlocking facilitates exposure of portions of lead-frame 110, thereby facilitating electrical connection of emitter-on-sub-mount device 105 to another component, such as a substrate of a device, as described below. Additionally, or alternatively, exposure of portions of lead-frame 110 on the bottom of emitter-on-sub-mount device 105 facilities use of a reflow process to connect emitter-on-sub-mount device 105 to another component (e.g., reflow of epoxy, solder, and/or the like), thereby facilitating use of a high-volume manufacturing process when installing emitter-on-sub-mount device 105 in a device (which reduces costs and/or time associated with manufacturing the device), thereby reducing or eliminating a need for wire bonds 140 on a bottom of emitter-on-sub-mount device 105 (which reduces costs, conserves material, reduces complexity, and/or the like associated with manufacturing a device that includes emitter-on-sub-mount device 105), and/or the like.

In this way, emitter-on-sub-mount device 105 may be configured with a sub-mount that includes lead-frame 110 interlocked with carrier 115. In addition, lead-frame 110 may have a CTE that matches a CTE of optical device 125 (or a layer of optical device 125 that is associated with mechanically connecting optical device 125 to lead-frame 110). This reduces or eliminates a difference between expansion of a sub-mount of emitter-on-sub-mount device 105 and optical device 125, thereby reducing or eliminating a negative impact of heat generated during operation of emitter-on-sub-mount device 105. In addition, by including a sub-mount that includes lead-frame 110 and carrier 115, emitter-on-sub-mount device 105 may be manufactured more cheaply and/or with fewer defects relative to other emitter-on-sub-mount devices (e.g., due to cheaper materials being used for carrier 115, due to carrier 115 facilitating wider manufacturing tolerances, and/or the like). Further, emitter-on-sub-mount device 105 conserves resources (e.g., costs, time, and/or materials) that would otherwise be consumed replacing emitter-on-sub-mount device 105, as a result of emitter-on-sub-mount device 105 failing prior to the end of a predicted operating life of emitter-on-sub-mount device 105, and/or the like.

As indicated above, FIGS. 1A and 1B are provided merely as one or more examples. Other examples may differ from what is described with regard to FIGS. 1A and 1B. The number and arrangement of components of emitter-on-sub-mount device 105 shown in FIGS. 1A and 1B also are provided as one or more examples. In practice, emitter-on-sub-mount device 105 may include additional components, fewer components, different components, or differently arranged components than those shown in FIGS. 1A and 1B.

Figure 2:
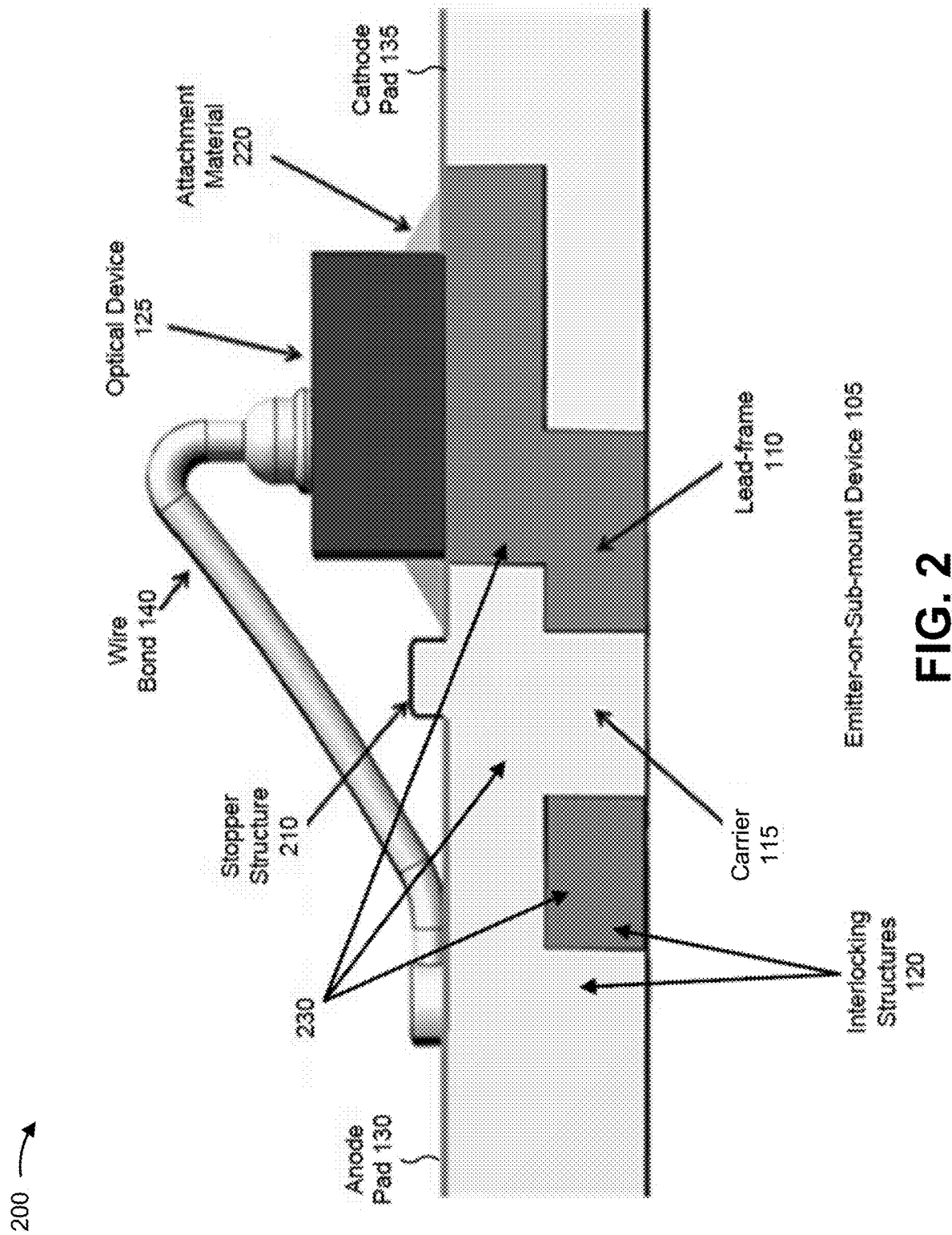
FIG. 2 is a diagram of a cross-sectional side view of an example implementation.

FIG. 2 is a diagram 200 of a cross-sectional side view of the emitter-on-sub-mount device of an example implementation. As shown in FIG. 2, emitter-on-sub-mount device 105 may include a stopper structure 210. For example, emitter-on-sub-mount device 105 may include a stopper structure 210 between anode pad 130 and cathode pad 135. In some implementations, and as shown in FIG. 2, stopper structure 210 may be associated with carrier 115. For example, stopper structure 210 may be formed as a component of carrier 115 (e.g., via etching, stamping, molding, etc.), may be formed separately from carrier 115 and mechanically attached to carrier 115, and/or the like.

In some implementations, stopper structure 210 may electrically isolate portions of anode pad 130 and cathode pad 135 (e.g., portions on which wire bond 140 and optical device 125 are attached). Additionally, or alternatively, stopper structure 210 may prevent attachment material 220 (e.g., epoxy, solder, paste, and/or the like) used to mechanically and/or electrically connect optical device 125 to cathode pad 135 from contacting anode pad 130, thereby preventing attachment material 220 from shorting anode pad 130.

In some implementations, such as in a p-down configuration of emitter-on-sub-mount device 105, stopper structure 210 may perform similar functions from the perspective of anode pad 130 (e.g., may prevent attachment material 220 used to attach optical device 125 to anode pad 130 from contacting cathode pad 135, may electrically isolate anode pad 130 and cathode pad 135, and/or the like). In some implementations, emitter-on-sub-mount device 105 may include one or more other, or different, stopper structures 210 to perform similar functions for one or more other components of emitter-on-sub-mount device 105.

In this way, stopper structure 210 operates as a physical barrier to flow of attachment material 220. By including stopper structure 210, a distance between anode pad 130 and cathode pad 135 may be reduced relative to an emitter-on-sub-mount device that does not include stopper structure 210 (e.g., in an emitter-on-sub-mount device that does not include stopper structure 210, anode pad 130 and cathode pad 135 may need to be spaced relatively further apart to reduce a likelihood that attachment material used with respect to cathode pad 135 will contact anode pad 130). This facilitates more compact dimensions of emitter-on-sub-mount device 105, which increases the uses of emitter-on-sub-mount device 105, conserves material and/or costs associated with manufacturing emitter-on-sub-mount device 105 (e.g., by reducing an amount of material needed to manufacture components of emitter-on-sub-mount device 105), and/or the like.

Reference number 230 shows a cross-sectional side view of the interlocking of lead-frame 110 and carrier 115. For example, the cross-sectional side view shows various mesas, cavities, openings, trenches, and/or the like used for interlocking lead-frame 110 and carrier 115.

As indicated above, FIG. 2 is provided merely as an example. Other examples may differ from what is described with regard to FIG. 2. The number and arrangement of components of emitter-on-sub-mount device 105 shown in FIG. 2 also are provided as an example. In practice, emitter-on-sub-mount device 105 may include additional components, fewer components, different components, or differently arranged components than those shown in FIG. 2.

Figure 3A:
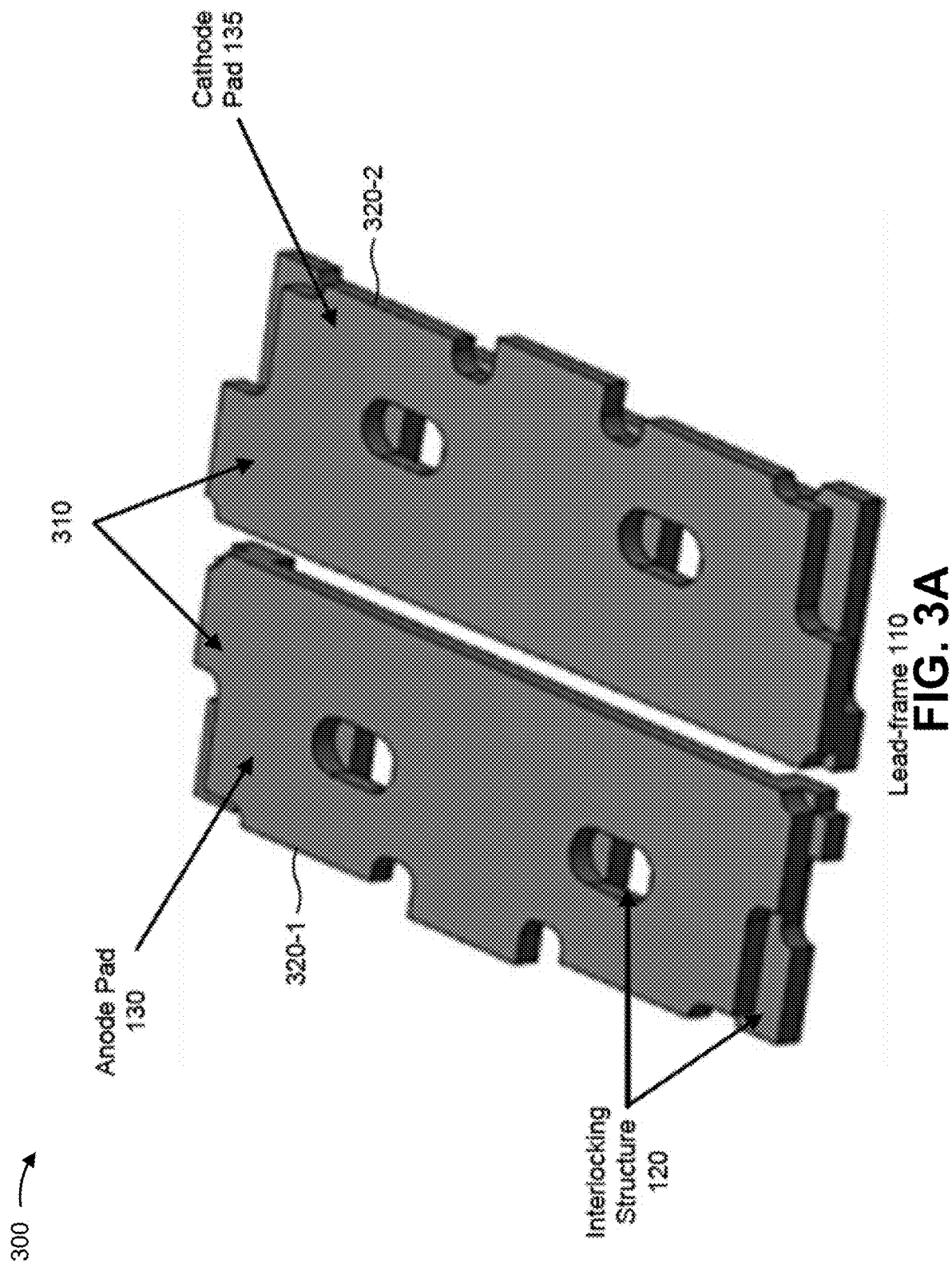
FIGS. 3A and 3B are diagrams of an example lead-frame of an emitter-on-sub-mount device.
Figure 3B:
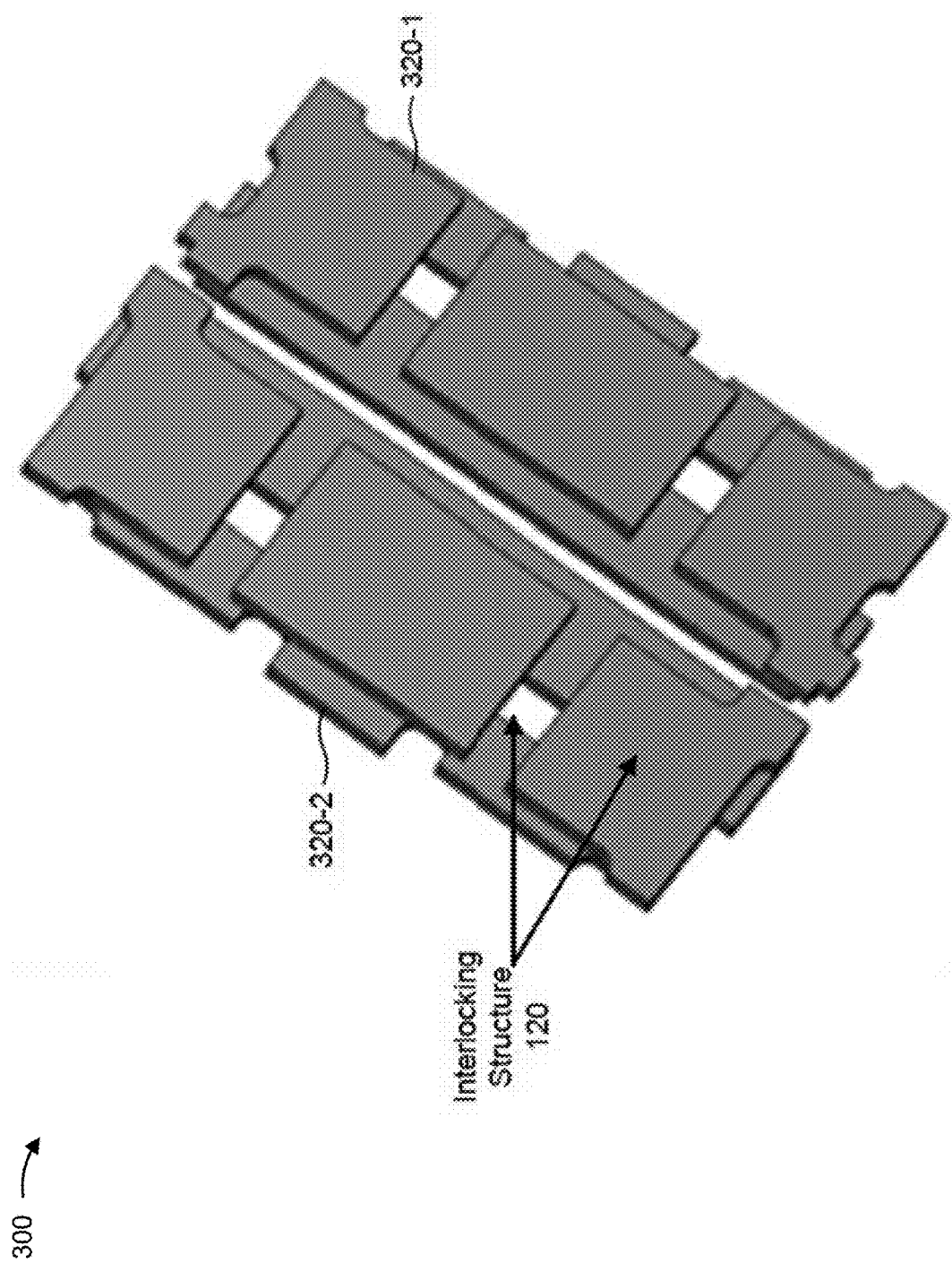

FIGS. 3A and 3B are diagrams 300 of an example lead-frame of an emitter-on-sub-mount device. 3A shows a top view of lead-frame 110. As shown by reference number 310, lead-frame 110 may include multiple portions. For example, lead-frame 110 may include a first portion associated with anode pad 130 (shown by reference number 320-1) and a second portion associated with cathode pad 135 (shown by reference number 320-2). Continuing with the previous example, FIG. 3A shows that the first portion and the second portion are not mechanically connected to each other. In some implementations, the portions of lead-frame 110 may be physically connected, but may be electrically isolated due to use of electrically resistive material between the portions. In some implementations, the portions of lead-frame 110 may be formed as a single component and may be separated from each other prior to assembly of emitter-on-sub-mount device 105. In some implementations, the portions of lead-frame 110 may be formed as a single component and may be separated from each other during singulation of emitter-on-sub-mount device 105. Conversely, the portions of lead-frame 110 may be formed separately.

FIG. 3B shows a bottom view of lead-frame 110. Although FIGS. 3A and 3B show the first portion and the second portion of lead-frame 110 as having similar shapes, similar configurations of interlocking structures 120, similar sizes, and/or the like, in practice the first and second portions may have different shapes, different configurations of interlocking structures 120, different sizes, and/or the like from each other and/or from what is shown in FIGS. 3A and 3B.

As indicated above, FIGS. 3A and 3B are provided merely as one or more examples. Other examples may differ from what is described with regard to FIGS. 3A and 3B. The number and arrangement of components of lead-frame 110 shown in FIGS. 3A and 3B also are provided as one or more examples. In practice, lead-frame 110 may include additional components, fewer components, different components, or differently arranged components than those shown in FIGS. 3A and 3B.

Figure 4A:
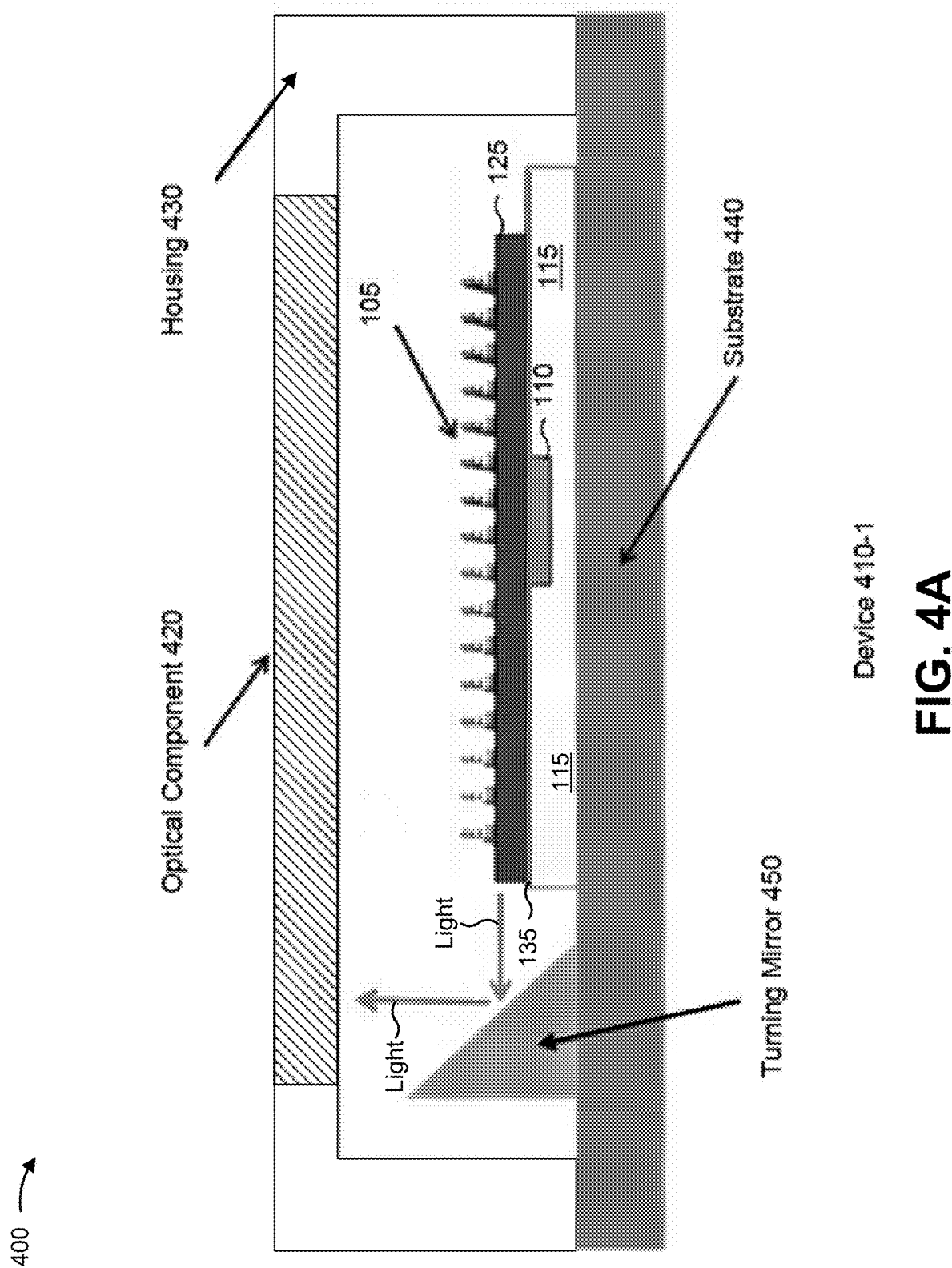
FIGS. 4A and 4B are diagrams of cross-sectional side views of various devices that include an emitter-on-sub-mount device.
Figure 4B:
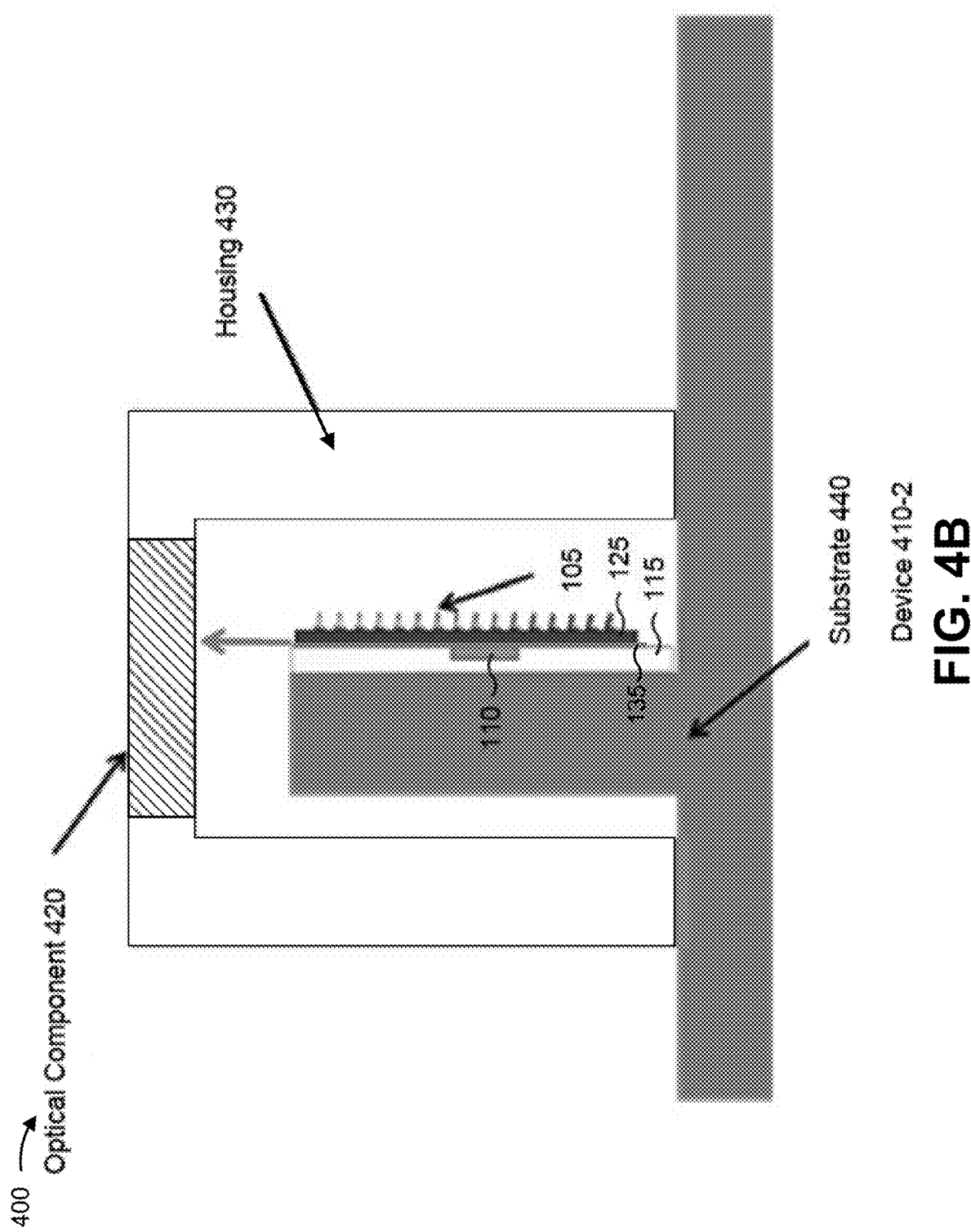

FIGS. 4A and 4B are diagrams 400 of cross-sectional side views of various devices that include an emitter-on-sub-mount device. FIG. 4A shows a first device (e.g., device 410-1) that includes emitter-on-sub-mount device 105. In some implementations, emitter-on-sub-mount device 105 may be similar to that described elsewhere herein. For example, emitter-on-sub-mount device 105 may include lead-frame 110 and optical device 125 wherein lead-frame 110 and optical device 125 have matching CTEs. As shown in FIG. 4A, device 410-1 may include an optical component 420. For example, optical component 420 may include a diffractive optical element (DOE), a lens, a plate of glass, a plate of plastic, and/or the like via which light from emitter-on-sub-mount device 105 exits device 410-1. In some implementations, optical component 420 may be included in housing 430. In some implementations, optical component 420 may be mechanically connected to housing 430.

In some implementations, housing 430 may include one or more plastic, metal, and/or the like components that form a case or enclosure for one or more components of device 410-1 (e.g., for emitter-on-sub-mount device 105 and turning mirror 450). As further shown in FIG. 4A, device 410-1 may include substrate 440 to which emitter-on-sub-mount device 105 and/or one or more other components of device 410-1 are mechanically and/or electrically connected. For example, substrate 440 may include a printed circuit board (PCB), a plate of plastic, a plate of metal, and/or the like. In some implementations, emitter-on-sub-mount device 105 may be mechanically and/or electrically connected to substrate 440 via use of epoxy, surface mount soldering, and/or the like. In some implementations, substrate 440 may be an integral part of housing 430.

As further shown in FIG. 4A, device 410-1 may include a turning mirror 450. For example, turning mirror 450 may include a metallic coated component, an angled prism mirror, a beam turning assembly, and/or the like. In some implementations, turning mirror 450 may be configured to direct light emitted horizontally from optical device 125 for vertical emission from device 410-1 (e.g., by changing the direction of travel of the light).

FIG. 4B shows a second device (e.g., device 410-2) in which emitter-on-sub-mount device 105 may be included. For example, emitter-on-sub-mount device 105 may include lead-frame 110 and optical device 125, similar to that described elsewhere herein. Continuing with the previous example, lead-frame 110 and optical device 125 may have matching CTEs. As shown in FIG. 4B, device 410-2 may include optical component 420 and housing 430 similar to that described with regard to FIG. 4A. In addition, device 410-2 may include substrate 440. As shown in FIG. 4B, substrate 440 may include a horizontal portion and a vertical portion that is perpendicular to the horizontal portion. In some implementations, emitter-on-sub-mount device 105 may be mechanically and/or electrically connected to the vertical portion. In this configuration, emitter-on-sub-mount device 105 can emit light from device 410-2 without the need for turning mirror 450 (e.g., due to alignment of an emission surface of emitter-on-sub-mount device 105 (an edge of emitter-on-sub-mount device 105 in this case) with optical component 420), thereby conserving costs, material, time, and/or the like associated with fabricating device 410. Further, this configuration facilitates a more compact device 410 relative to device 410-1.

As indicated above, FIGS. 4A and 4B are provided merely as one or more examples. Other examples may differ from what is described with regard to FIGS. 4A and 4B. The number and arrangement of components of devices 410 shown in FIGS. 4A and 4B are provided as one or more examples. In practice, device 410 may include additional components, fewer components, different components, or differently arranged components than those shown in FIGS. 4A and 4B.

Figure 5:
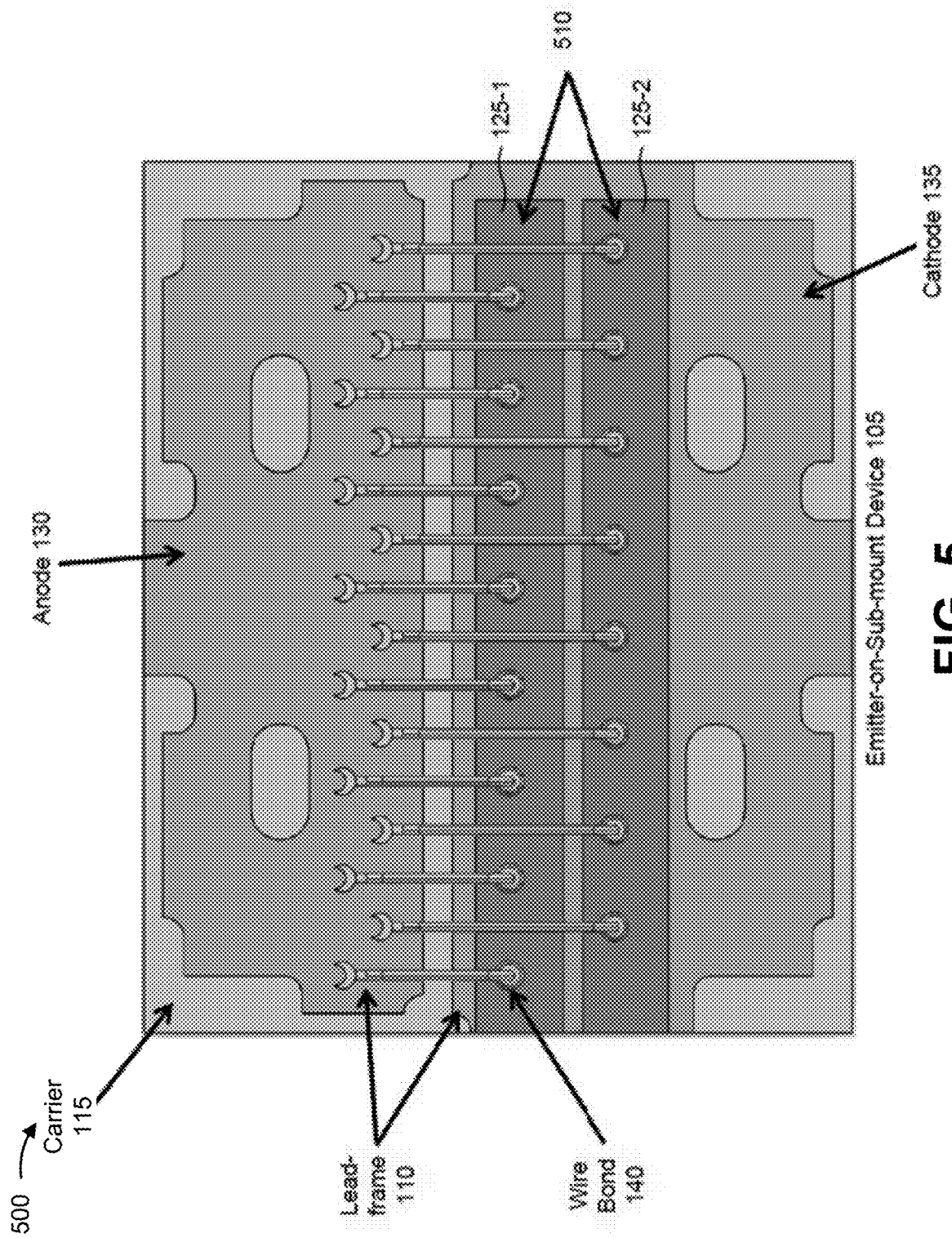
FIG. 5 is a diagram of an example emitter-on-sub-mount device that includes multiple optical devices.

FIG. 5 is a diagram 500 of a top view an example emitter-on-sub-mount device that includes multiple optical devices. As shown by reference number 510, emitter-on-sub-mount device 105 includes optical devices 125-1 and 125-2. In some implementations, optical devices 125-1 and 125-2 may each include a single emitter or multiple emitters. In some implementations, emitter-on-sub-mount device 105 may include more than two optical devices 125.

As further shown in FIG. 5, optical devices 125-1 and 125-2 may be connected to anode pad 130 via a respective set of wire bonds 140. Although FIG. 5 shows optical devices 125-1 and 125-2 connected in parallel to anode pad 130, other implementations of emitter-on-sub-mount device 105 may include multiple optical devices 125 connected in series, may include multiple optical devices 125 where a subset of the multiple optical devices 125 is connected in series and another subset of multiple optical devices 125 is connected in parallel, may include a single optical device 125 with multiple emitters where a subset of the emitters is connected in series and another subset of the emitters is connected in parallel, and/or the like, depending on power needs at lower current and higher voltage, due to laser driver limitations, and/or the like.

In some implementations, lead-frame 110 and optical devices 125 shown in FIG. 5 may be similar to that described elsewhere herein. For example, lead-frame 110 and optical devices 125 may have matching CTEs.

As indicated above, FIG. 5 is provided merely as an example. Other examples may differ from what is described with regard to FIG. 5. The number and arrangement of components of emitter-on-sub-mount device 105 shown in FIG. 5 also are provided as one or more examples. In practice, emitter-on-sub-mount device 105 may include additional components, fewer components, different components, or differently arranged components than those shown in FIG. 5.

The foregoing disclosure provides illustration and description, but is not intended to be exhaustive or to limit the implementations to the precise forms disclosed. Modifications and variations may be made in light of the above disclosure or may be acquired from practice of the implementations.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
    a lead-frame comprising a first electrode and a second electrode;
    a carrier;
    a set of optical devices mechanically and electrically connected to the first electrode; and
    a set of electrical connections that electrically connects the second electrode to the set of optical devices,
        wherein the lead-frame and the carrier are mechanically connected to each other via a set of interlocking structures associated with the lead-frame and the carrier,
        wherein the lead-frame and the set of optical devices have matching coefficients of thermal expansion,
        wherein the first electrode and the second electrode are electrically isolated from each other.

2. The device of claim 1, wherein the matching coefficients of thermal expansion include a first coefficient of thermal expansion for the lead-frame and a second coefficient of thermal expansion for each of the set of optical devices, wherein the second coefficient of thermal expansion is within twenty percent of the first coefficient of thermal expansion.

3. The device of claim 1, wherein the lead-frame comprises copper tungsten (CuW).

4. The device of claim 1, wherein the carrier comprises a liquid crystal polymer (LCP) or a silicone molding compound (SMC).

5. The device of claim 1, wherein the first electrode is associated with a first portion of the lead-frame and the second electrode is associated with a second portion of the lead-frame,
wherein the first portion and the second portion are different,
wherein the first portion and the second portion are electrically isolated from each other.

6. The device of claim 1, wherein the carrier comprises a stopper structure between the first electrode and the second electrode,
wherein the stopper structure is associated with preventing attachment material used to mechanically and electrically connect the set of optical devices to the first electrode from contacting the second electrode.

7. The device of claim 1, wherein the set of optical devices and the set of electrical connections are mechanically connected to a top surface of the device, and
wherein a portion of the lead-frame on a bottom surface of the device is exposed.

8. The device of claim 1, wherein the set of optical devices includes multiple optical devices electrically connected in series or in parallel to the second electrode via the set of electrical connections.

9. The device of claim 1, wherein the device is included in another device that includes:
a housing for the device,
an optical component in the housing, or
a substrate to which the device is mechanically connected.

10. A lead-frame, comprising:
a first portion;
a second portion; and
a respective set of interlocking structures associated with the first portion and the second portion,
wherein an optical device is mechanically and electrically connected to the first portion,
wherein the first portion and the second portion are electrically isolated from each other,
wherein the first portion is associated with a first electrical pad,
wherein the second portion is associated with a second electrical pad,
wherein the lead-frame has a first coefficient of thermal expansion that matches a second coefficient of thermal expansion of the optical device.

11. The lead-frame of claim 10, wherein the first portion and the second portion comprise copper tungsten (CuW).

12. The lead-frame of claim 10, wherein the respective set of interlocking structures for the first portion and the second portion are configured to mate with a corresponding set of interlocking structures associated with a carrier.

13. The lead-frame of claim 10, wherein the first portion and the second portion are plated with an electrically conductive metal.

14. The lead-frame of claim 10, wherein a difference between the second coefficient of thermal expansion is within twenty percent of the second coefficient of thermal expansion.

15. A device, comprising:
a housing;
an optical component mechanically connected to the housing;
a substrate mechanically connected to the housing; and
an emitter-on-sub-mount device mechanically connected to the substrate and within the housing, comprising:
a lead-frame comprising a first electrode and a second electrode, and
a set of optical devices mechanically and electrically connected to the first electrode and electrically connected to the second electrode,
wherein the lead-frame and the set of optical devices have matching coefficients of thermal expansion.

16. The device of claim 15, wherein the first electrode is associated with a first portion of the lead-frame and the second electrode is associated with a second portion of the lead-frame that is different than the first portion,
wherein the first portion and the second portion are electrically isolated from each other.

17. The device of claim 15, wherein the device further comprises:
a turning mirror mechanically connected to the substrate,
wherein the turning mirror is configured to direct light from the emitter-on-sub-mount device in a particular direction that is different than an emission direction of the emitter-on-sub-mount device.

18. The device of claim 15, wherein the substrate comprises a horizontal portion and a vertical portion within the housing,
wherein the emitter-on-sub-mount device is mechanically connected to the vertical portion to align an emission surface of the emitter-on-sub-mount device with the optical component.

19. The device of claim 15, wherein the set of optical devices includes multiple optical devices electrically connected to the second electrode in series or in parallel.

20. The device of claim 15, wherein the emitter-on-sub-mount device further comprises:
a sub-mount that includes the lead-frame and a carrier,
wherein the lead-frame and the carrier comprise different materials,
wherein the lead-frame and the carrier are mechanically connected to each other via a set of interlocking structures.

* * * * *